United States Patent [19]

Nguyen et al.

[11] Patent Number: 5,252,516
[45] Date of Patent: Oct. 12, 1993

[54] METHOD FOR PRODUCING INTERLEVEL STUD VIAS

[75] Inventors: Du B. Nguyen, Danbury, Conn.; Hazara S. Rathore, Stormville, N.Y.

[73] Assignee: International Business Machines Corporation, Armonk, N.Y.

[21] Appl. No.: 839,451

[22] Filed: Feb. 20, 1992

[51] Int. Cl.⁵ .................................. H01L 21/441
[52] U.S. Cl. ............................. 437/195; 437/238; 437/978; 437/979
[58] Field of Search ............... 148/DIG. 163, DIG. 43; 437/978, 195, 238, 979

[56] References Cited

U.S. PATENT DOCUMENTS

| | | |
|---|---|---|
| 4,686,000 | 8/1987 | Heath . |
| 4,721,689 | 1/1988 | Chaloux et al. . |
| 4,767,724 | 8/1988 | Kim et al. . |
| 4,789,648 | 12/1988 | Chow et al. . |
| 4,933,303 | 6/1990 | Mo . |
| 4,936,950 | 6/1990 | Doan et al. . |
| 4,997,789 | 3/1991 | Keller et al. . |

*Primary Examiner*—John S. Maples
*Attorney, Agent, or Firm*—Whitham & Marhoefer

[57] ABSTRACT

Metallized level is covered with a relatively thick non-conformal oxide layer, such as sputtered quartz ($SiO_2$). This layer is, in turn, covered with a relatively thin oxide blanket resistant to RIE, such as aluminum oxide ($Al_2O_3$) or Yttrium Oxide ($Y_2O_3$). A mask, with exposed via opening, is formed in a conventional manner on the aluminum oxide surface and the aluminum oxide in the open areas is removed, for example $Al_2O_3$ is etched with $BCl_3$ and $O_2$ gases or wet etch with $H_3PO_4$. An RIE process is used to form vias.

6 Claims, 2 Drawing Sheets

METHOD FOR PRODUCING INTERLEVEL STUD VIAS

BACKGROUND OF THE INVENTION

1. Field of the Invention

This invention relates to a process for manufacturing multi-level interconnections in integrated circuits for semiconductor devices, and more particularly, to an improved process that reduces interlevel defects when using a reactive ion etch (RIE) to form very small vias.

2. Description of the Prior Art

As illustrated in FIG. 1, one type of prior art multilayer interconnection of integrated circuits for semiconductor devices has a number of metal levels 10 interconnected by vias/studs 12. In this type of prior art multilayer metal interconnections are separated by silicon oxide layers 14 (e.g., sputtered quartz, ECR oxide, or PECVD oxide) covered with a passivating oxide layer 16 formed by chemical vapor deposition (PECVD silicon nitride). The via metallization is typically tungsten or aluminum copper and the wiring pattern metallization is typically an alloy, such as an aluminum-copper alloy. A RIE process is used to form vias with a very small feature size.

While generally satisfactory, a significant failure mode in the above-described multilevel interconnection of the integrated circuit is the occurrence of interlevel short circuits. Such shorts may be caused by photolithography misregistration, pinholes in the passivating oxide layer, metal fencing and metal particles. Examples of such defects are shown in FIG. 1 and labeled A, B, C, and D.

SUMMARY OF THE INVENTION

An object of this invention is the provision of a process that reduces interlevel defects in semiconductor chips that use a RIE process for forming via openings; a process that improves reliability and product yield.

Briefly, this invention contemplates the provision process in which a metallized level is covered with a relatively thick non-conformal oxide layer, such as sputtered quartz ($SiO_2$). This layer is, in turn, covered with a relatively thin oxide blanket resistant to RIE, such as aluminum oxide ($Al_2O_3$) or Yttrium Oxide ($Y_2O_3$). A mask, with exposed via opening, is formed in a conventional manner on the aluminum oxide surface and the aluminum oxide in the open areas is removed. For example $Al_2O_3$ is etched with $BCl_3$ and $O_2$ gases or with wet etch of $H_3PO_4$. An RIE process is used to form vias; an RIE process does not attack $Al_2O_3$ or $Y_2O_3$ oxide. Via metallization, such as tungsten, is then deposited as a blanket layer by conformal CVD, filling the via openings. A chemical mechanical polishing step is used to planarize the upper surface of the assembly, and remove the tungsten down to the upper surface of the thin oxide layer. The next metal level is then formed on this planarized surface using suitable prior art process steps including either a lift-off or metal RIE step in forming the metal pattern. The process is then repeated for successive layers starting with a relatively thick sputtered quartz coating.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
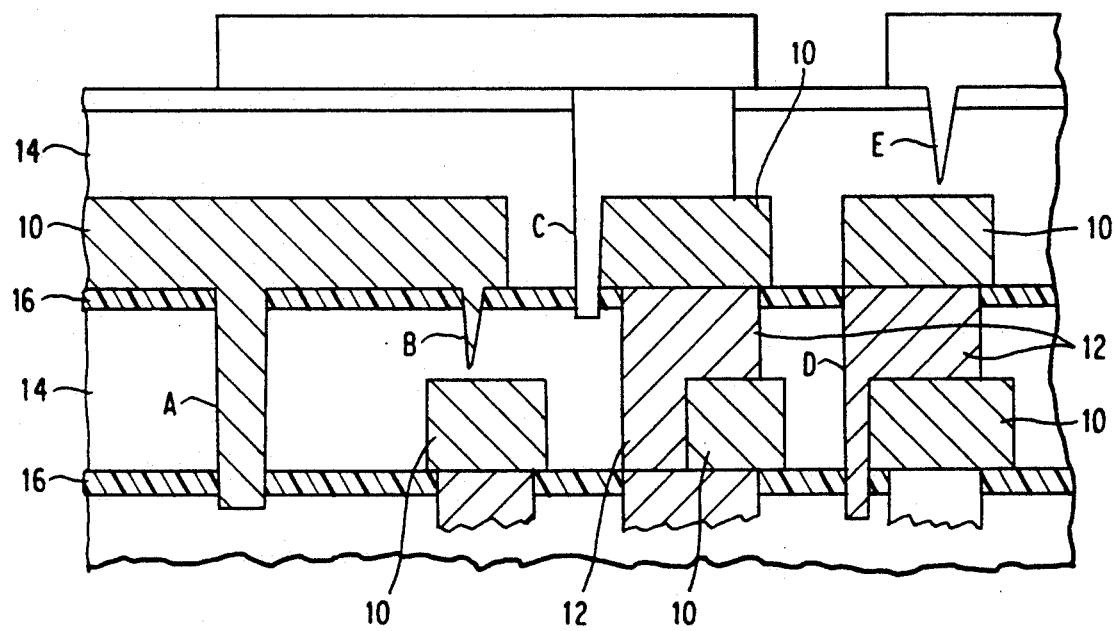
FIG. 1 is a representational, sectional view of a prior art multi-metal interconnection of integrated circuits, illustrating various interlevel defects which can occur with comparable prior art processes.

Referring now to the drawings, and more particularly to FIG. 2 (starting at FIG. 2A), as an initial step in this exemplary embodiment of the process of this invention, a relatively thick oxide layer 24 is formed over a metal level, represented here by a pattern of conductors 15 as in the prior art module of FIG. 1. The oxide layer 24 is formed by a non-conformal process and serves as a primary insulation for passivating the metal conductors 15 and for intralevel and interlevel insulation. The oxide layer may be, for example, sputtered silicone oxide ($SiO_2$), PECVD oxide, or electron-cyclotron resonance (ECR) oxide. The conductor pattern 15 is formed using a suitable prior art process (e.g., a lift-off process or a reactive ion etching of the metal) and the conductive material may be, for example, an aluminum-copper alloy.

Next, a relatively thin (e.g., 2.8–3.0 KÅ) layer 20 of oxide, such as aluminum oxide ($Al_2O_3$) or Yttrium ($Y_2O_3$) is formed on the top surface of the thick oxide layer 24 in order to passivate layer 24 in the event of misregistration or a defect, such as a pin hole or other defect, in layer 24. Layer 20 may be formed by CVD. The oxide layer 20 is not attacked by subsequent reactive ion etching used to form sub-micron via openings. Thus, layer 20 also serves as an etch stop and prevents accidental over etching in the event of a via opening misalignment.

Figure 2A:
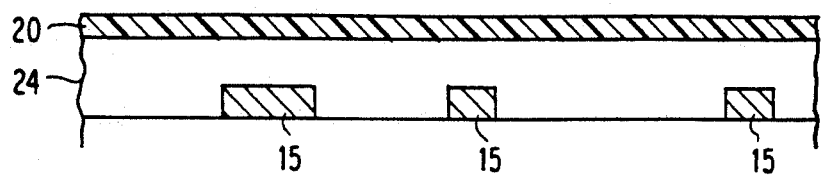
FIGS. 2A through 2G are representational, sectional views illustrating the status of a multi-metal interconnection of integrated circuits at various stages of manufacture following process steps in accordance with the teachings of this invention.
Figure 2B:
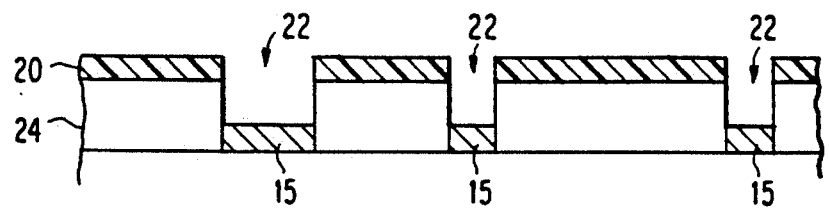

Referring now to FIG. 2B, the layer 20 is removed where it is desired to form via openings. This may be conveniently accomplished by the conventional steps of masking the layer, forming openings in the mask, and etching away the oxide layer 20 exposed by the openings. For example, $BCl_3$ and $O_2$ can be used to etch $Al_2O_3$ or wet etch process with $H_3PO_4$. Via openings 22 extending to the metal layer conductors 15 are next formed in the relatively thick oxide layer 24 by a RIE.

Figure 2C:
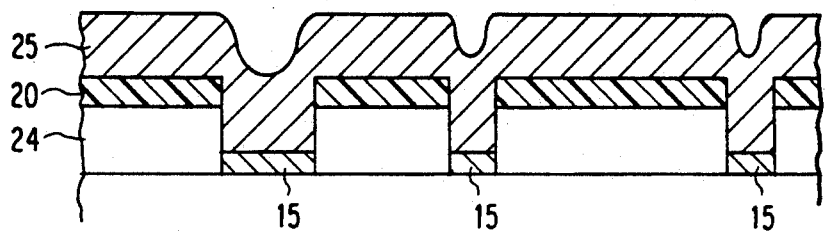
Figure 2D:
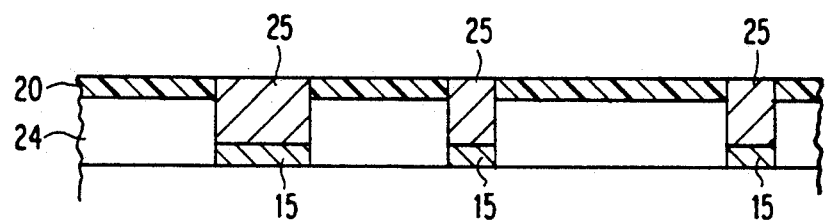

As illustrated in FIG. 2C, a conductive layer 25, preferably tungsten, is formed to fill the via openings 22; a tungsten layer 25 may be formed conveniently by CVD. A chemical-mechanical polishing step planarizes the assembly to the upper surface of the thin oxide layer 20, as illustrated in FIG. 2D.

Figure 2E:
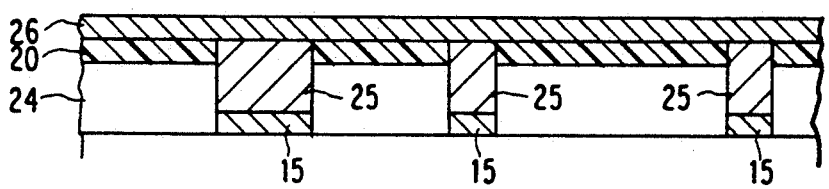
Figure 2F:
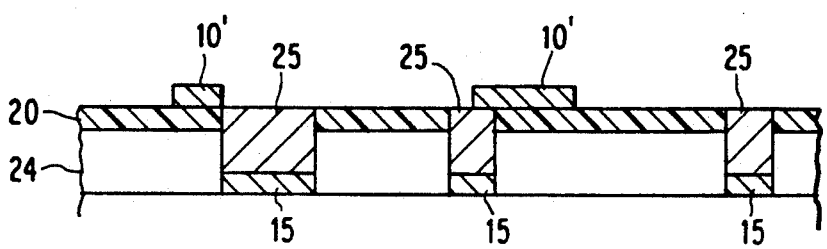
Figure 2G:
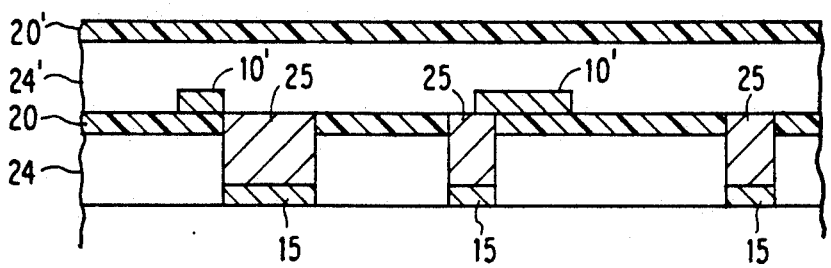

Referring now to FIG. 2E, a metallization layer 26 is formed on the planarized surface of the assembly, as shown in FIG. 2E. This second level metallization can be formed to a conductive pattern (10' FIG. 2F) using any suitable prior art process, such as lift-off or a metal reactive ion etch, for example. The process steps just described are then repeated, starting with the forming of a relatively thick oxide layer 24' that is then covered with a thin layer of oxide 20'. The wafer at this state in its manufacture is illustrated in FIG. 2G and is essentially the same state as illustrated in FIG. 2A.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of making multilayer, interconnected conductor patterns for a semiconductor device comprising the steps:
   (a) depositing a thick layer of silicone oxide by a non-conformal process over a conductive pattern that is raised above a insulating substrate to which it is secured;
   (b) depositing a layer that is thin relative to said thick layer of silicone oxide of an oxide resistant to reactive ion etching on the upper surface of said thick layer of silicone oxide;
   (c) removing said oxide from the surface of said silicone oxide in a pattern of desired via openings;
   (d) next reactive ion etching via openings that extend through said thick layer of silicone oxide;
   (e) depositing via metallization by a conformal process, covering the upper surface of said oxide and filling said via openings;
   (f) removing said via metallization back to the upper surface of said oxide layer by a chemical-machine process forming a planar surface with said oxide layer and the metallization in said via openings; and
   (g) forming a raised conductive pattern on said planar surface.

2. The method of making multilayer, interconnected conductor patterns for a semiconductor device as in claim 1 wherein said oxide resistant to reactive ion etching is aluminum oxide.

3. The method of making multilayer, interconnected conductor patterns for a semiconductor device as in claim 1 wherein said oxide resistant to reactive ion etching is Yttrium Oxide.

4. The method of making multilayer, interconnected conductor patterns for a semiconductor device as in claim 1 including the further steps of repeating steps a and b.

5. The method of making multilayer, interconnected conductor patterns for a semiconductor device as in claim 2 including the further steps of repeating steps a and b.

6. The method of making multilayer, interconnected conductor patterns for a semiconductor device as in claim 3 including the further steps of repeating steps a and b.

* * * * *